United States Patent
Eklund et al.

(10) Patent No.: US 6,377,195 B1
(45) Date of Patent: Apr. 23, 2002

(54) OFFSET COMPENSATION IN PARALLEL ANALOGUE-DIGITAL CONVERTERS

(75) Inventors: Jan-Erik Eklund, Linköping; Fredrik Gustafsson, Ljungsbro, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/544,335

(22) Filed: Apr. 6, 2000

(30) Foreign Application Priority Data

Apr. 7, 1999 (SE) .............................................. 9901233

(51) Int. Cl.⁷ .............................................. H03M 1/10
(52) U.S. Cl. ........................ 341/118; 341/120; 341/155
(58) Field of Search ................................ 341/118, 143, 341/155, 161

(56) References Cited

U.S. PATENT DOCUMENTS

| | | | | |
|---|---|---|---|---|
| 4,633,226 A | * | 12/1986 | Black, Jr. ................... | 341/159 |
| 4,994,805 A | * | 2/1991 | Dedic ......................... | 341/143 |
| 5,272,481 A | | 12/1993 | Sauer | |
| 5,459,464 A | * | 10/1995 | Bénéteau et al. ........... | 341/143 |
| 5,585,796 A | | 12/1996 | Svensson et al. | |
| 5,675,334 A | * | 10/1997 | McCartney ................. | 341/118 |
| 6,137,431 A | * | 10/2000 | Lee et al. ................... | 341/161 |

FOREIGN PATENT DOCUMENTS

WO     99/34517     7/1999

OTHER PUBLICATIONS

Jiren Yuan et al., IEEE Journal of Solid State Circuits, vol. 29 No. 8, Aug. 1994, pp. 866–873 "A 10-bit 5-MS/s Successive Approximation ADC Cell Used in a 70-MS/s ADC Array in 1.2-$\mu$m CMOS".

* cited by examiner

Primary Examiner—Howard L. Williams
(74) Attorney, Agent, or Firm—Burns, Doane, Swecker & Mathis, L.L.P.

(57) ABSTRACT

The present invention relates to a method of offset compensating a parallel analogue-digital converter that includes at least two channels (35), where the analogue to digital conversion takes place simultaneously in the various channels but offset relative to respective channels. An analogue input signal (10) to the analogue-digital converter is multiplied by +1 or by −1 in accordance with an arbitrary pattern and the output signal from the analogue-digital converter is multiplied by +1 or by −1 in accordance with the same arbitrary pattern as that by which the input signal was multiplied. The invention also includes a parallel analogue-digital converter for carrying out the method.

9 Claims, 3 Drawing Sheets

US 6,377,195 B1

OFFSET COMPENSATION IN PARALLEL ANALOGUE-DIGITAL CONVERTERS

FIELD OF INVENTION

The present invention relates to a method and to an arrangement according to the preambles of respective independent claims 1 and 4.

BACKGROUND OF THE INVENTION

The digitalisation of an analogue signal requires the use of an analogue-digital converter. High sampling speeds are required to convert a real time analogue signal to a digital format. One way of achieving the requisite sampling speed in real time conversion is to use so-called parallel analogue-digital converters.

An example of one such parallel analogue-digital converter is described in U.S. Pat. No. 5,585,796.

One problem with this type of analogue-digital converter is that the individual analogue-digital conversion channels have mutually different offsets. A parallel analogue-digital converter including several time multiplexed channels where each channel has a unique offset gives rise to undesirable frequency components in an output signal from such an analogue-digital converter.

This has been solved with an analogue offset compensation of the type correlated double-sampling as described in "A 10-bit 5MS/s successive approximation ADC cell used in a 70MS/s ADC array in 1.2 $\mu$m CMOS", IEEE Journal of Solid State Circuits, Vol. 29, No. 8, pp. 866–872, Aug. 1994, J. Yuan and C. Svensson.

The drawback with this technique is that the analogue offset compensation takes a certain amount of time to put into effect, in this case four clock periods, therewith increasing the time required by a channel for conversion.

SUMMARY OF THE INVENTION

The present invention addresses the aforesaid problems by providing a method for offset compensation in parallel channel analogue-digital converters according to claim 1, and a parallel channel analogue-digital converter according to claim 4.

The object of the present invention is to provide a method of digital offset compensation which will at least reduce the aforesaid problems.

In this regard, one particular object of the present invention is to provide a method of offset compensation in parallel channel analogue-digital converters in which the offset to be compensated can be allowed to be large without having an effect on the signal to noise ratio of the output signal.

One advantage with the present invention is that the analogue components in the analogue-digital converter influencing the offset can be made with relatively poor precision without influencing the precision of the output signal.

Another advantage with the present invention is that the method can be easily implemented.

A preferred embodiment of the invention has the advantage of enabling the offset to be removed by subtracting a mean value of the output signal from the analogue-digital converter for each channel, therewith enabling the offset to be large.

The invention will now be described in more detail with reference to preferred embodiments thereof and also with reference to the accompanying drawings.

DESCRIPTION OF PREFERRED EMBODIMENTS

Figure 1:
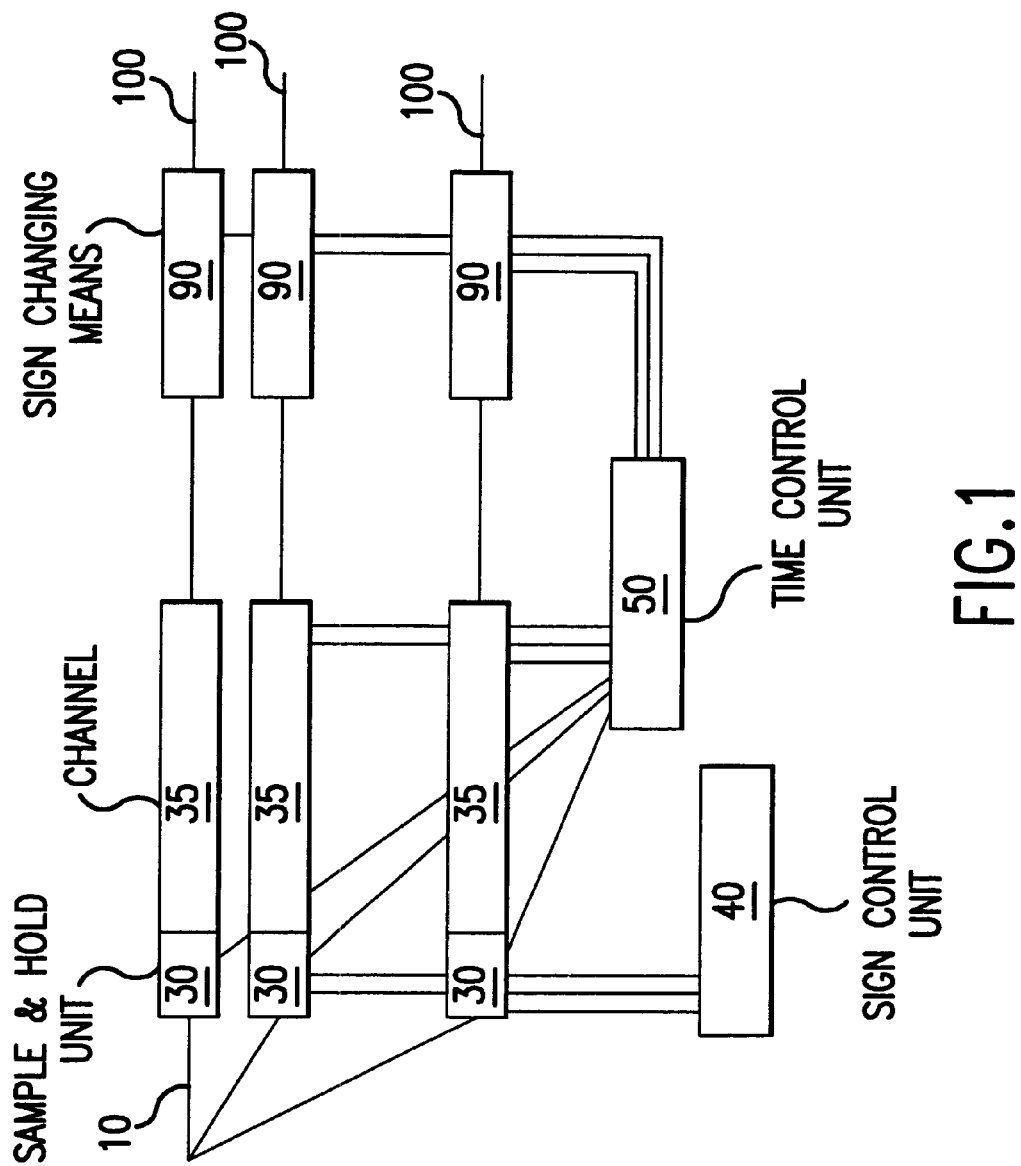
FIG. 1 is a block schematic illustrating a first embodiment of an inventive parallel channel analogue-digital converter.

FIG. 1 illustrates an exemplifying embodiment of a parallel channel analogue-digital converter according to the invention. A parallel channel analogue-digital converter includes at least two analogue-digital converters, which are referred to as channels in this document. In the embodiment shown in FIG. 1, the analogue-digital converter includes three channels 35. A sample-and-hold unit 30, which also includes a sign changing means, is connected to each input of the channels shown in FIG. 1. An analogue input signal 10 is excited into the sample-and-hold units connected to the inputs of the various channels. The analogue signal is sampled in the sample-and-hold unit with a given frequency. The sampling frequency is controlled by a time control unit 50. The sign of the sampled value is also changed in the sample-and-hold unit. The sign change in each sample-and-hold unit takes place individually and changes the sign on the signal in a pseudo random manner. A common sign changing means can be used by all channels, instead of providing a sign changing means for each individual channel.

The sign change is controlled by a sign control unit 40, which may be a Pseudo Random Binary Sequence (PRBS), which is well known to the person skilled in this art and which need not therefore be described in detail. Subsequent to the signal having passed the sample-and-hold unit and the sign changed in a pseudo random manner, the signal can be said to constitute noise with a zero mean value.

The signal then continues to and through each of the analogue-digital converters. A so-called offset is added in the analogue-digital converters. Each of the various channels generally has a unique offset. The channels in a parallel analogue-digital converter are time multiplexed. Conversion of the analogue signal to a digital signal in a parallel analogue-digital converter takes place in the various channels in a time offset relative to each channel. This offset repeats as a signal having a specific pattern.

Time multiplexing of the various channels is controlled by the time control unit 50. Subsequent to having passed through the various channels, the signal can be said to consist of noise and an offset.

The original signal can be recreated and the effect of the offset reduced, by passing the output signal from the various channels through a sign changing means, as illustrated in FIG. 1. By changing the sign of the output signal from each of the channels in the sign changing means 90 in accordance with the same pseudo random pattern with which the sign of the input signal was changed, the pseudo random sequence will now act on the offset instead of on the signal. The signal is therewith restored (correct sign) and the energy contained by the offset appears as noise in the frequency domain. Distortion peaks or spikes in an output signal spectrum have thus disappeared and been replaced by noise.

The output signals 100 from respective sign changes 90 are multiplexed in accordance with the same sequence as that in which they are demultiplexed, so as to obtain a digital representation of the analogue input signal.

Figure 2:
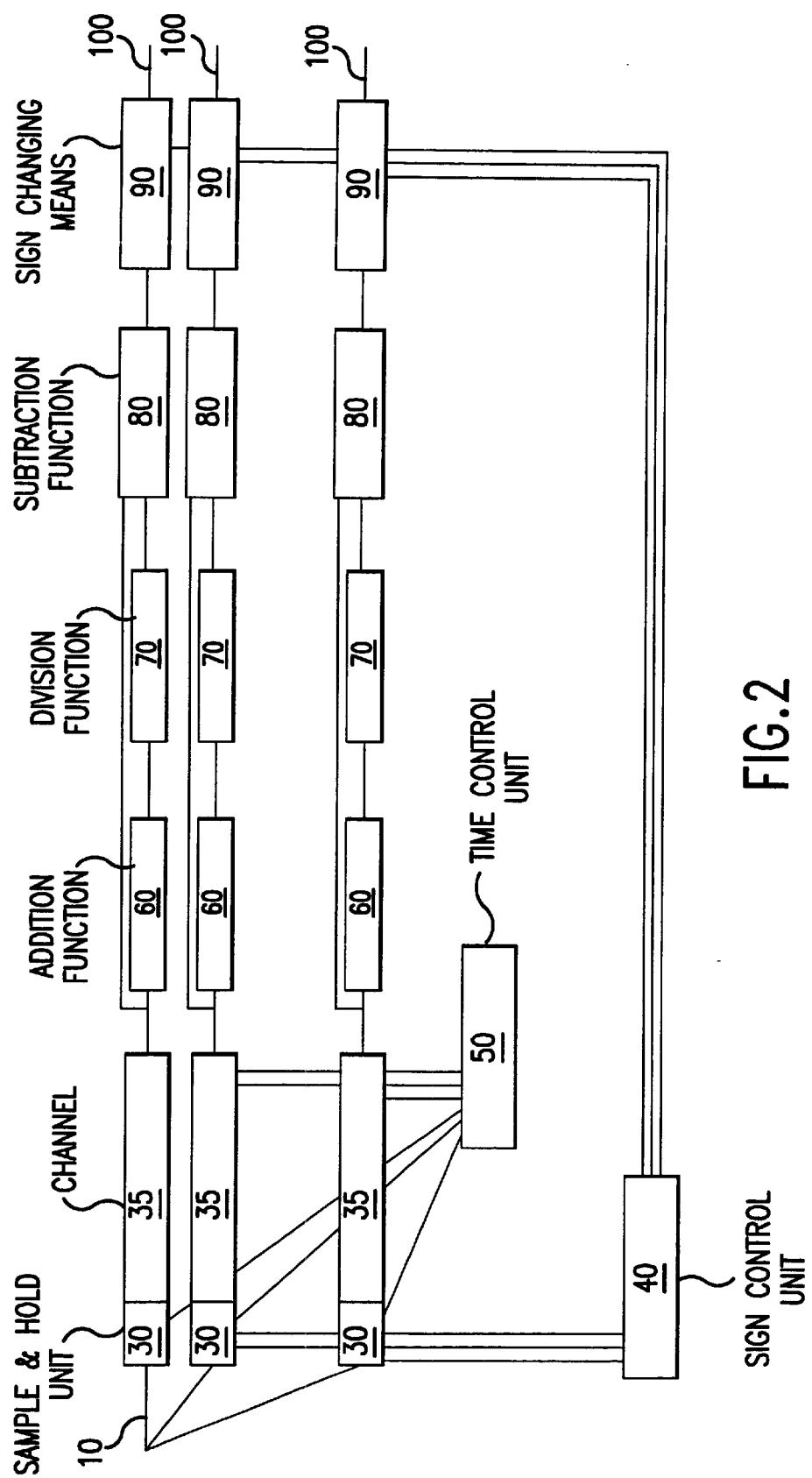
FIG. 2 is a block schematic illustrating a second embodiment of an inventive parallel channel analogue-digital converter.

FIG. 2 illustrates another embodiment of an inventive parallel analogue-digital converter. This embodiment reachieves a reduction in the effect of the various offsets of the channels on the output signal. The offset can be essentially eliminated, by subtracting from each of the channels an output signal mean value, before the output signal from said various channels passes a sign changing means.

FIG. 2 illustrates an embodiment in which the analogue-digital converter includes three channels 35. Connected to the input of the channels shown in FIG. 2 is a sample-and-hold unit which also includes a sign changing means. An analogue input signal 10 is excited into the sample-and-hold units connected to the inputs of the various channels. The analogue signal is sampled in the sample-and-hold unit with a given frequency. The frequency at which sampling takes place is controlled by a time control unit 50. A change of sign of the sampled value also takes place in the sample-and-hold unit. The sign change in each sample-and-hold unit takes place individually and changes the sign on the signal in a pseudo random manner. The sign change is controlled by a sign control unit 40, which may comprise a Pseudo Random Binary Sequence (PRBS), which is well known to the person skilled in this art and will not therefore be described in more detail. Subsequent to the signal having passed through the sample-and-hold unit and the sign having been changed in a pseudo random manner, the signal can be said to comprise noise with a zero mean value.

The signal then continues to and through each of the analogue-digital converters. A so-called offset is added in the analogue-digital converters. Each of the various channels has generally a unique offset. The channels in a parallel analogue-digital converter are time multiplexed. Conversion of the analogue signal to a digital signal in a parallel analogue-digital converter takes place in the various channels in a time offset relative to one another. This offset repeats as a signal having a specific pattern.

Time multiplexing for the various channels is controlled by the time control unit 50. Subsequent to having passed through the various channels, the signal can be said to consist of noise and an offset.

The original signal can be restored and the effect of the offset reduced to a minimum, by permitting the output signal from the various channels in FIG. 2 to pass first through an addition function 60 and then through a division function 70 and finally through a subtraction function 80 before the signal passes a sign changing means 90. The offset can be significantly reduced, by first subtracting a mean value from the output signal of each of said channels, and the signal can then be given the correct sign by changing the sign in the sign changing means 90 in accordance with the same pseudo random pattern with which the sign of the input signal was changed. Because the correct signal has a random appearance with a zero mean value, the mean value of output data from the channel is determined solely by the offset. The offset is not eliminated completely, because the formation of the mean value is restricted by numerical precision.

Instead of subtracting a mean value from the signal from respective channels, the offset can be determined alternatively by generating artificially periodic sequences that have the same frequencies as the spectral components in the digital signal deriving from the offset.

General methods of disturbance suppression are based on measuring or artificially generating an interference base and then estimating adaptively respective weights. In the illustrated case, the offset O can be described as a linear combination of base functions B and weights w.

A unit vector for each offset is the simplest choice of base functions. Standard logarithms, such as LMS logarithms (Least Mean Square) can then be used, where the special sign-sign version of LMS is suitable for implementation, since no multiplication, divisions or additions are required and solely one counter is used instead.

M-number of different offset levels result in M-number of spectral components in the digital signal.

Figure 3:
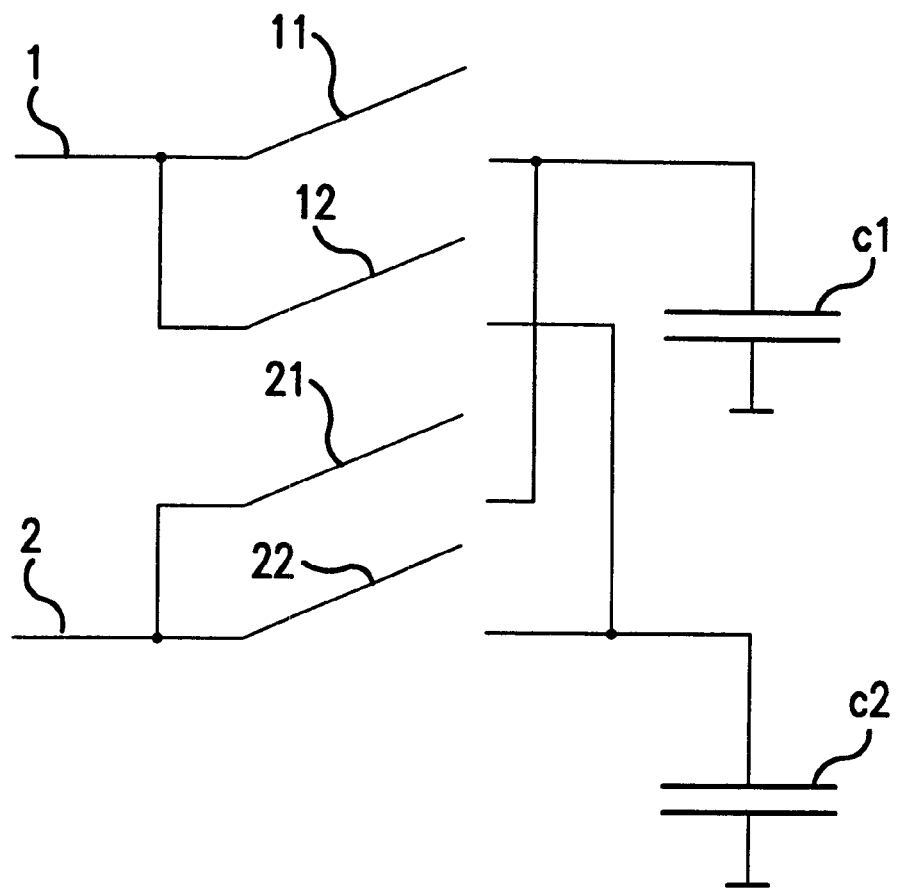
FIG. 3 illustrates an embodiment of a combined sample-and-hold unit and a sign changing means.

FIG. 3 illustrates one way of implementing a sign changing means in a sample-and-hold unit. The analogue input signal to the parallel analogue-digital converter is preferably differential. A differential system has the advantage of being more robust against interference and disturbances than a system that includes signal conductors and return conductors (most often earth). The signal information in a differential system arrives in two conductors and has the value va on one conductor and vb on the other conductor. In the FIG. 1 illustration, it can be assumed that the value va is found on the one conductor 1 and the value vb is found on the other conductor 2. The signal can then be represented as S=va−vb.

The signal is sampled on the input of the analogue-digital converter, in two sampling capacitors c1 and c2, by closing the switches 11 and 22 very briefly and then reopening the switches. The charge stored in the capacitors is then the signal which is later used as the input signal to the analogue-digital converter.

$$Qsignal = cs1 * va - cs2 *\ vb.$$

Cs1 and cs2 are most often identical. In order to implement a sign changing means (chopper), i.e. to implement multiplication with −1 and +1, only two additional switches 12 and 21 are required. These switches are used to sample with reversed signs. Assume that vb=−va and cs1=cs2=CS. Normal (+1) sampling will then be $$Qsignal = CS*va - CS*(-va) = 2*CS\, va.$$

Sampling with the sign reversed will be $$Qsignal = CS*(-va) - CS*va = -2*CS*va.$$

Multiplication with −1 is required in order to recreate the signal subsequent to it having been transformed to a digital format. This is simple and well known in the case of binary numbers and need not be described in detail here.

The invention is, of course, not restricted to the aforedescribed and illustrated exemplifying embodiments thereof, since modifications can be made within the scope of the accompanying claims.

What is claimed is:

1. A method of offset compensating a parallel analogue-digital converter that includes at least two channels, where an analogue-digital conversion in said channels takes place in a time offset relative to one another, comprising:

multiplying the analogue input signal to the analogue-digital converter by +1 or −1 in accordance with an arbitrary pattern;

multiplying the output signal from the analogue-digital converter by +1 or −1 in accordance with the same arbitrary pattern as that used to multiply the input signal;

subtracting a mean value of the output signal from each channel prior to multiplying said output signal by said arbitrary pattern; and subjecting the output signal to an interference suppression process prior to multiplying said output signal by said arbitrary pattern.

2. A method according to claim 1, wherein said process is a LMS process (Least Mean Square).

3. A method according to claim 1, comprising creating said arbitrary pattern by controlling a sign changing means by means of a PRBS-generator (Pseudo Random Binary Sequence).

4. A parallel channel analogue-digital converter which includes at least two channels and with which analogue-digital conversion in the various channels takes place in a time offset relative to each channel, wherein the parallel channel analogue-digital converter includes:

means for multiplying the analogue input signal to the analogue-digital converter by +1 or by −1 in accordance with arbitrary pattern;

means for multiplying the output signal from the analogue-digital converter by +1 or by −1 in accordance with the same arbitrary pattern as that by which the input signal was multiplied;

means for calculating the mean value of the output signal from each channel in the parallel channel analogue-digital converter;

means for subtracting said mean value from said output signal; and means for subjecting the output signal to an interference suppression process prior to multiplying the output signal by said arbitrary pattern.

5. A parallel channel analogue-digital converter according to claim 4, wherein the means for multiplying the analogue input signal to the analogue-digital converter by +1 or by −1 in accordance with an arbitrary pattern is common to all channels.

6. A parallel channel analogue-digital converter according to claim 4, wherein said means for multiplying the analogue input signal to the analogue-digital converter by +1 or −1 according to an arbitrary pattern is individual to each channel.

7. A parallel channel analogue-digital converter according to claim 4, wherein the means for multiplying the input signal to the analogue-digital converter and the output signal from said analogue-digital converter by +1 or −1 in accordance with an arbitrary pattern is a sign changing means controlled by PRBS-generator (Pseudo Random Binary Sequence).

8. A parallel channel analogue-digital converter according to claim 4, wherein the analogue-digital conversion is of the successive approximation type.

9. A parallel channel analogue-digital converter according to claim 4, wherein said process is an LMS process (Least Mean Square).

* * * * *